United States Patent
Tanaka et al.

(10) Patent No.: US 6,753,093 B2
(45) Date of Patent: Jun. 22, 2004

(54) HEAT DISSIPATING MATERIAL AND MANUFACTURING METHOD THEREOF

(75) Inventors: Katsufumi Tanaka, Kariya (JP); Kyoichi Kinoshita, Kariya (JP); Takashi Yoshida, Kariya (JP); Tomohei Sugiyama, Kariya (JP); Eiji Kono, Kariya (JP)

(73) Assignee: Kabushiki Kaisha Toyota Jidoshokki, Kariya (JP)

( * ) Notice: Subject to any disclaimer, the term of this patent is extended or adjusted under 35 U.S.C. 154(b) by 0 days.

(21) Appl. No.: 10/247,953

(22) Filed: Sep. 20, 2002

(65) Prior Publication Data

US 2003/0066621 A1 Apr. 10, 2003

(30) Foreign Application Priority Data

Sep. 21, 2001 (JP) ........................................ 2001-288122

(51) Int. Cl.⁷ ..................... B32B 7/02; B32B 15/01; B32B 15/18
(52) U.S. Cl. ................... 428/615; 428/553; 428/554; 428/620; 428/681; 428/539.5
(58) Field of Search .................. 428/615, 553, 428/554, 620, 681, 539.5

(56) References Cited

U.S. PATENT DOCUMENTS

| 5,025,347 A | * | 6/1991 | Shindo et al. ............... 361/719 |
| 5,844,310 A | * | 12/1998 | Okikawa et al. ............ 257/712 |
| 5,981,085 A | * | 11/1999 | Ninomiya et al. .......... 428/614 |
| 6,129,993 A | * | 10/2000 | Kumamoto et al. ........ 428/614 |
| 6,132,676 A | * | 10/2000 | Holzer et al. ................. 419/20 |
| 6,381,094 B1 | * | 4/2002 | Gill ............................. 360/126 |
| 6,597,574 B2 | * | 7/2003 | Kinoshita et al. ........... 361/704 |

FOREIGN PATENT DOCUMENTS

| JP | 60-16431 | 1/1985 |
| JP | 2001-90730 | 4/2001 |

* cited by examiner

*Primary Examiner*—Deborah Jones
*Assistant Examiner*—Jason L Savage
(74) *Attorney, Agent, or Firm*—Morgan & Finnegan, LLP

(57) ABSTRACT

A heat spreader includes an electromagnetic soft iron sheet and a plating layer formed on the surface of the sheet. The plate is made of a rustproof metal. An electronic component is mounted on an aluminum base with an HITT substrate and the heat spreader in between. The heat spreader is manufactured at low cost and has a favorable property as a heat dissipating material.

11 Claims, 2 Drawing Sheets

HEAT DISSIPATING MATERIAL AND MANUFACTURING METHOD THEREOF

BACKGROUND OF THE INVENTION

The present invention relates to a heat dissipating material and a method for manufacturing the material. More particularly, the present invention pertains to a heat dissipating material suitable for heat dissipating substrate, on which electronic components such as semiconductor devices are mounted.

Since electronic components such as semiconductor devices produce heat during operation, such components need to be cooled so that the performance will not lowered. Accordingly, methods for implementing semiconductor devices on a heat dissipating board (heat dissipating substrate) have been proposed. These methods include a method using a heat sink and a method using a heat spreader.

A heat sink using method is shown in FIG. 4. A heat sink 42 is fixed to an aluminum base 41, which forms a case, with screws (not shown). The heat sink 42 may be soldered to the aluminum base 41. An insulated substrate 43 is fixed to the heat sink 42. The insulated substrate 43 has metal (Al) layer 43a on each side. An electronic component 44 such as a semiconductor device is implemented onto the upper metal layer 43a of the insulated substrate 43. The insulated substrate 43 is made of aluminum nitride (AlN). The heat sink 42 is made of a material having a low expansion coefficient and a high thermal conductivity. Specifically, the heat sink 42 is made of metal matrix composite, which has ceramics dispersed in a metal matrix layer. For example, a composite having SiC particles dispersed in an aluminum main component is used.

Aluminum nitride of the insulated substrate 43 and the metal matrix composite of the heat sink 42 are expensive. Therefore, an inexpensive method using a heat spreader has also been proposed.

A heat spreader using method is shown in FIG. 5. A high insulated thermal technology (HITT) substrate 45 is secured to the upper surface of an aluminum base 41, which forms a case, with silicone grease. The HITT substrate 45 includes an aluminum main body 45a, an epoxy resin insulating layer 45b, and a metal (copper) layer 45c. The insulating layer 45b is adhered to an opposite side of the main body 45a from the aluminum base 41. The metal layer 45c is laminated on the insulating layer 45b. A heat spreader 46 is soldered onto the HITT substrate 45. An electronic component 44 is soldered onto the heat spreader 46. Currently, heat spreaders are made of Cu, Mo or a three-layer laminated material of Cu/Invar/Cu. Invar is an alloy containing 36% of weight of Ni. The remaining portion of Invar is substantially Fe.

However, Cu has a relatively great linear expansion coefficient of $17 \times 10^{-6}/°$ C. Therefore, matching between Cu and the electronic component 44, the linear expansion coefficient of which is $4 \times 10^{-6}/°$ C., is not satisfactory. Also, since Mo has a relatively low linear expansion coefficient of $4 \times 10^{-6}/°$ C. to $5 \times 10^{-6}/°$ C., matching between Mo and the HITT substrate 45 is not satisfactory.

On the other hand, the three-layer laminated material of Cu/Invar/Cu, which is used nowadays, has a linear expansion coefficient of $10 \times 10^{-6}/°$ C. to $11 \times 10^{-6}/°$ C. Thus, the laminated material has satisfactory matching with the electronic component 44 and the HITT substrate 45. However, Invar contained in the laminated material has a significantly small thermal conductivity. Thus, although Invar is held between Cu layers having a relatively high thermal conductivity ($390W/(m·K)$), the heat expansion of the heat spreader 46 in the direction of thickness is as small as $30W/(m·K)$. As a result, if considered as a uniform material, the heat conductivity of the three-layer laminated material is as small as $60W/(m·K)$, which is not sufficient for dissipating heat. Further, since Invar is held between Cu layers, the cost is increased.

SUMMARY OF THE INVENTION

Accordingly, it is an objective of the present invention to provide an inexpensive heat dissipating material that can be used as a heat spreader.

To achieve the foregoing and other objectives and in accordance with the purpose of the present invention, a plate-shaped heat dissipating material is provided. The main component of the material is an iron-based metal, and at least the surface of the material is covered with a rustproof metal.

The present also provides an electronic module including a plate shaped heat dissipating material and an electronic element. The main component of the material is an iron-based metal, and at least the surface of the material is covered with a rustproof metal. The electronic element is mounted on the heat dissipating material.

The present invention further provides a method for manufacturing a heat dissipating material. The method includes: placing metal shaving in a mold; pouring a molten aluminum-based metal or molten copper into the mold and impregnating the metal shaving with the molten aluminum-based metal or the molten copper; and taking out the molded material as the heat dissipating material from the mold after the aluminum-based metal or the copper is solidified.

The present invention provides another method for manufacturing a heat dissipating material. The method includes: forming a porous sintered compact with powder of an iron-based metal; placing the sintered compact in a mold; pouring and pressurizing a molten aluminum-based metal or molten copper into the mold, and impregnating the sintered compact with the molten aluminum-based metal or the molten copper; and taking out the molded material as the heat dissipating material from the mold after the aluminum-based metal or the copper is solidified.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A first embodiment of the present invention will now be described with reference to FIGS. 1(a) and 1(b).

Figure 1:
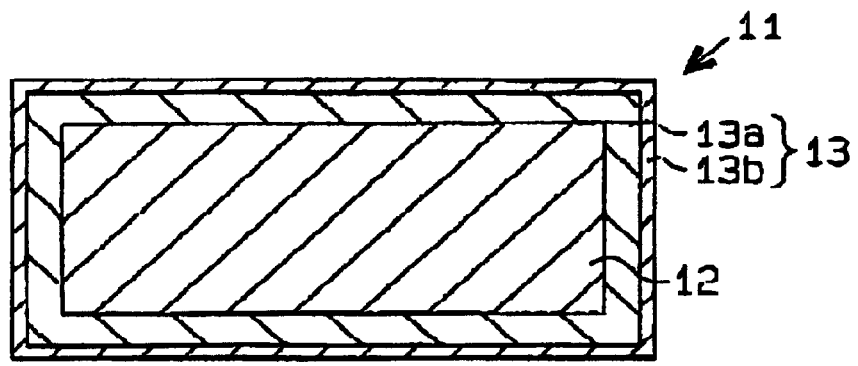
FIG. 1(a) is a schematic cross-sectional view illustrating a heat spreader according to a first embodiment of the present invention.
FIG. 1(b) is a schematic cross-sectional view illustrating a semiconductor module on which the heat spreader of FIG. 1(a) is mounted.
Figure 1:
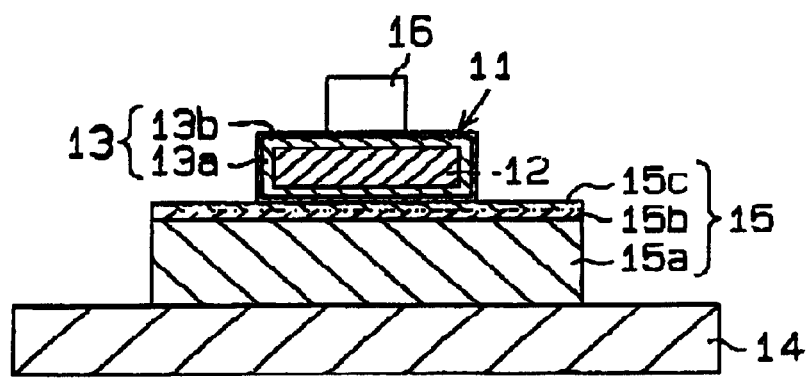

FIG. 1(a) is schematic cross-sectional view illustrating a heat dissipating material. In this embodiment, the heat dissipating material is a heat spreader 11. FIG. 1(b) is a schematic cross-sectional view illustrating a semiconductor module (electronic module) using the heat spreader 11. As shown in FIGS. 1(a) and 1(b), the heat spreader 11 includes an electromagnetic soft iron sheet 12 and a protective layer formed on the surface of the iron sheet 12. In this embodiment, the protective layer is a plating layer 13. That is, the heat spreader 11 is a plate the main component of which is an iron-based metal. At least the surface of the heat spreader 11 is coated with rustproof metal. Pure iron, cast iron, carbon steel, or low alloy steel having alloy content element no more than 5% may be used as the iron-based metal. In this embodiment, the iron-based metal is the electromagnetic soft iron.

The plating layer 13 includes an electrolytic Ni plating layer 13a and an Ni—B plating layer 13b. The electrolytic Ni plating layer 13a is formed on the surface of the electromagnetic soft iron sheet 12. The Ni—B plating layer 13b is the outermost layer. The thickness of the electrolytic Ni plating layer 13a is 20 µm. The thickness of the Ni—B plating layer 13b is a few micrometers. The Ni—B plating layer 13b reduces pinholes in the electrolytic Ni plating layer 13a and improves the corrosion resistance of the electrolytic Ni plating layer 13a. The thickness of the electromagnetic soft iron sheet 12 is, for example, 1 mm. Even if the thickness of the iron sheet 12 is changed, the thickness of the electrolytic Ni plating layer 13a and the thickness of the Ni—B plating layer 13b will be substantially constant.

When implementing a semiconductor device using the heat spreader 11, a high insulated thermal technology (HITT) substrate 15 is soldered onto an aluminum base 14 as shown in FIG. 1(b). The aluminum base 14 forms a case. The HITT substrate 15 includes an aluminum main body 15a, an epoxy resin insulating layer 15b, and a metal (copper) layer 15c. The insulating layer 15b is adhered to an opposite side of the main body 15a from the aluminum base 14. The metal layer 15c is laminated on the insulating layer 15b. The heat spreader 11 is soldered onto the HITT substrate 15. An electronic component (silicon chip) 16 such as a semiconductor device is soldered onto the heat spreader 11.

As in the case in which a three-layer laminated material of Cu/Invar/Cu is used in a heat spreader, the electromagnetic soft iron has a favorable matching with the electronic component 16 and with the HITT substrate 15 since the linear expansion coefficient of the electromagnetic soft iron is approximately $11 \times 10^{-6}/°$ C. Further, since the thermal conductivity of the soft magnetic material is 80W/(m·K), the heat dissipating property of the heat spreader 11 is better than that of the three-layer laminated material.

This embodiment provides the following advantages.

(1) The heat spreader 11 is a plate the main component of which is iron-based metal. At least the surface of the heat spreader 11 is coated with rustproof metal. Thus, compared to a prior art method in which a three-layer laminated material of Cu/Invar/Cu is used and to a prior art method in which Cu or Mo is used as a heat spreader, the heat spreader 11 is inexpensive. Further, since at least the surface is coated with the rustproof metal, the iron-based metal is resistant to rusting.

(2) The heat spreader 11 is constructed by using the electromagnetic soft iron as the iron-based metal and forming the plating layer 13 on the electromagnetic soft iron sheet 12. Therefore, by simply forming the plating layer 13 on the metal plate of the soft magnetic metal (industrial pure iron), which is less expensive than invar, the linear expansion coefficient of $11 \times 10^{-6}/°$ C. is obtained and the thermal conductivity greater than that of a three-layer laminated material of Cu/Invar/Cu is obtained. As a result, the heat spreader 11 has a satisfactory matching with the electronic component 16 and with the HITT substrate. The heat spreader 11 is therefore reliable.

(3) The plating layer 13 includes the electrolytic Ni plating layer 13a and the Ni—B plating layer 13b. The Ni—B plating layer 13b is the outermost layer. This facilitates the soldering of the heat spreader 11 onto the HITT substrate 15 and the soldering of the electronic component 16 onto the heat spreader 11.

(4) If the electrolytic Ni plating layer 13a is exposed, pinholes are likely to be formed. However, the Ni—B plating layer 13b on the electrolytic Ni plating layer 13a reduces pinholes and improves the corrosion resistance.

A second embodiment of the present invention will now be described with reference to FIGS. 2 to 3(b). The embodiment of FIGS. 2 to 3(b) is significantly different from the embodiment of FIGS. 1(a) and 1(b) in that the iron-based material is powder.

Figure 2:
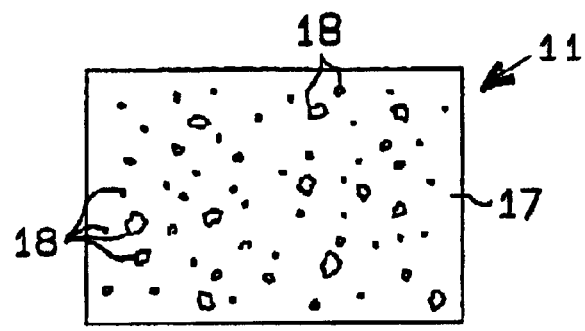
FIG. 2 is a schematic cross-sectional view illustrating a heat spreader according to a second embodiment of the present invention.

FIG. 2 is a schematic cross-sectional view illustrating a heat spreader 11. As shown in FIG. 2, the heat spreader 11 includes a metallic matrix 17 made of an aluminum-based metal or copper. The metallic matrix 17 is charged with powder 18 of an iron-based metal. That is, the heat spreader 11 is formed by impregnating the powder 18 of iron-based metal with aluminum-based metal or copper as the metallic matrix 17 and then solidifying the matrix 17. The aluminum-based metal refers to aluminum or aluminum alloy.

The metallic matrix 17, which is formed or aluminum-based metal or copper, is a rustproof metal. The powder 18 of iron-based metal is covered by the rustproof metallic matrix 17. Therefore, as in the first embodiment of FIGS. 1(a) and 1(b), at least the surface of the heat spreader 11 of the second embodiment is coated with rustproof metal.

Metal shaving (shaving generated during machining) is used as the powder 18 of the iron-based metal. In this embodiment, shaving of cast iron (swarf of case metal) is used. The volume content of the powder 18 is determined such that the linear expansion coefficient of the heat spreader 11 is $14 \times 10^{-6}/°$ C. to $15 \times 10^{-6}/°$ C. For example, the volume content of the powder 18 is set to 49 volume % to 51 volume %. The maximum diameter of the particles in the powder 18 is, for example, 180 µm, and the average diameter is, for example 100 µm.

Figure 3A:
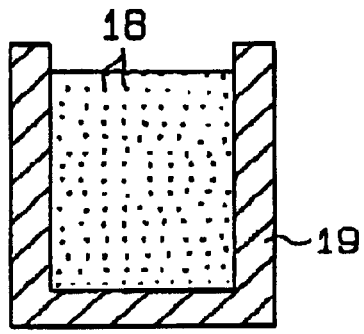
FIGS. 3(a) and 3(b) are schematic cross-sectional views illustrating a method for manufacturing the heat spreader of FIG. 2.
Figure 3B:
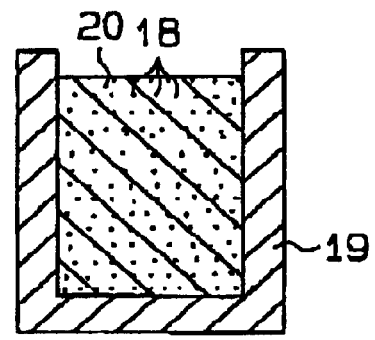
Figure 4:
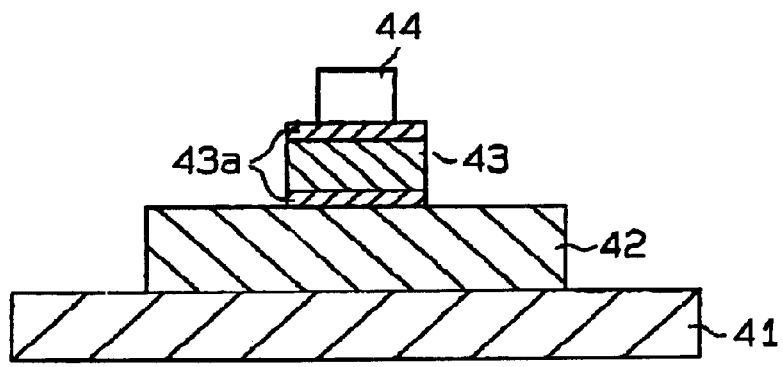
FIG. 4 is a schematic cross-sectional view illustrating a semiconductor module having a prior art heat sink.
Figure 5:
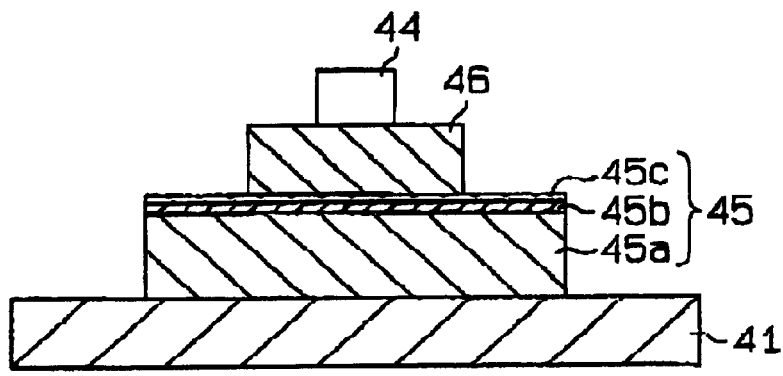
FIG. 5 is a schematic cross-sectional view illustrating a semiconductor module having a prior art heat spreader.

A method for manufacturing the heat spreader 11, which is constructed as above, will hereafter be described with reference to FIGS. 3(a) and 3(b). As shown in FIG. 3(a), a predetermined amount of the powder 18 of cast iron is charged into a mold 19. Then, molten metal 20, which is molten aluminum metal or molten copper, is poured into the mold 19 to impregnate the powder 18 with the molten metal 20. After the molten metal 20 is solidified, the molded material is taken out of the mold 19. The manufacture of the heat spreader 11 is thus completed.

In addition to the same advantage (1) of the embodiment shown in FIGS. 1(a) and 1(b), the embodiment shown in FIGS. 2 to 3(b) has the following advantages.

(5) The heat spreader 11 is formed by charging the powder 18 of the iron-based metal in the metallic matrix 17 of the aluminum-based metal or copper, and the linear expansion coefficient of the heat spreader 11 is $14 \times 10^{-6}/°$ C. to $15 \times 10^{-6}/°$ C. Therefore, by adjusting the volume content of the powder 18, the linear expansion coefficient of the heat spreader 11 can be optimized. Accordingly, the heat spreader 11 has an improved thermal conductivity and heat dissipating property compared to a three-layer laminated material of Cu/Invar/Cu.

(6) No preform needs to be formed from the powder 18 of the iron-based metal. That is, the heat spreader 11 is formed simply charging the powder 18 of cast iron into the mold 19, impregnating the powder 18 with the molten metal 20, and then solidifying the powder 18 and the molten metal 20. Thus, compared to a case in which a preform is formed, the heat spreader 11 is manufactured at a lower cost.

(7) Metal dust of cast iron is used as the powder 18 of the iron-based metal, which further reduces the costs.

It should be apparent to those skilled in the art that the present invention may be embodied in many other specific forms without departing from the spirit or scope of the invention. Particularly, it should be understood that the invention may be embodied in the following forms.

In the first embodiment, the plating layer 13 formed on the electromagnetic soft iron sheet 12 need not include both of the electrolytic Ni plating layer 13a and the electrolytic Ni—B plating layer 13b. For example, the plating layer 13 may include only the electrolytic Ni plating layer 13a.

The plating layer 13 may be replaced with a plating layer of a metal other than Ni as long as the metal has a low electrical resistance.

Instead of the cast iron, other type of iron-based metal may be used as the powder 18. For example, carbon steel, low alloy steel, or electromagnetic soft iron may be used. This modification has the same advantages as the second embodiment. As long as the volume content is the same, the heat dissipating property of material using electromagnetic soft iron powder is better than a material using cast iron powder.

A sintered porous preform may be formed with the powder 18 of iron-based metal, and the dissipating material may be formed by impregnating the sintered compact with aluminum-based metal or copper. For example, the sintered preform is placed in a mold, and pressurized molten aluminum-based metal or pressurized molten copper is cast in the mold. After being solidified, the molded material is taken out of the mold. The porosity of the sintered compact is 49 to 51%. The porosity is computed based on the volume and the weight of the sintered compact. In this case, the sintered preform of the iron-based metal is formed and impregnated with molten metal. Thus, compared to the second embodiment in which no preform is formed, the cost is increased. However, the cost for forming sintered preform is lower than a case in which a preform is formed by thermal spraying. Since aluminum-based metal has a lower melting temperature than copper and is lighter than copper, aluminum-based metal is more preferable the metal for impregnation. A composite was formed using a Cr containing iron as the iron-based metal and aluminum as molten metal. The volume content of the iron-based metal was approximately 60%. The heat conductivity was 140W/(m·K) to 150W/(m·K), and the linear expansion coefficient was $15 \times 10^{-6}/°$ C.

In a case where the surface of the electromagnetic soft iron sheet 12 is coated with rustproof metal like the first embodiment, the plating layer 13 may be cladded with metal foil. For example, the electromagnetic soft iron sheet 12 may be cladded with Ni foil. Compared to the case where the coating layer is formed only with the electrolytic Ni plating layer, the number of pinholes is reduced and creation of voids in solder is suppressed, which improves the reliability.

The heat dissipating material may be used for purposes other than implementing of semiconductor devices.

The mold 19 need not be made of metal. For example, the mold 19 may be made of ceramics.

Therefore, the present examples and embodiments are to be considered as illustrative and not restrictive and the invention is not to be limited to the details given herein, but may be modified within the scope and equivalence of the appended claims.

What is claimed is:

1. A plate-shaped heat dissipating material, wherein the main component of the material is an iron-based metal, and wherein the entire surface of the material exposed to the environment is covered with a rustproof metal.

2. The heat dissipating material according to claim 1, comprising:

a plate made of the iron-based metal; and a protective layer made of the rustproof metal, wherein the protective layer covers the entire surface of the plate exposed to the environment.

3. The heat dissipating material according to claim 2, wherein the plate is made of an electromagnetic soft iron, and wherein the protective layer is a plating layer.

4. The heat dissipating material according to claim 3, wherein the plating layer includes an inner Ni plating layer and an outer Ni—B plating layer.

5. The heat dissipating material according to claim 2, wherein the plate is made of an electromagnetic soft iron, and wherein the protective layer is made of an Ni foil.

6. The heat dissipating material according to claim 1, wherein the rustproof metal is an aluminum-based metal or copper, wherein the heat dissipating material is formed by impregnating powder of the iron-based metal with a metallic matrix, which is the aluminum-based metal or the copper, and wherein the volume content of the iron-based metal is determined such that the linear expansion coefficient of the heat dissipating material is $14 \times 10^{-6}/°$ C. to $15 \times 10^{-6}/°$ C.

7. The heat dissipating material according to claim 6, wherein the iron-based metal powder is metal shaving.

8. The heat dissipating material according to claim 1, wherein the rustproof metal is an aluminum-based metal or copper, wherein the heat dissipating material is formed by impregnating a porous sintered compact made of the iron-based metal powder with a metallic matrix, which is the aluminum-based metal or the copper, and wherein the volume content of the iron-based metal is determined such that the linear expansion coefficient of the heat dissipating material is $14 \times 10^{-6}/°$ C. to $15 \times 10^{-6}/°$ C.

9. The heat dissipating material according to claim 8, wherein the iron-based metal powder is metal shaving.

10. The heat dissipating material according to claim 1, wherein the rustproof metal covers the entire surface of the material.

11. An electronic module, comprising;

a plate-shaped heat dissipating material, wherein the main component of the material is an iron-based metal, and wherein the entire surface of the material exposed to the environment is covered with a rustproof metal; and an electronic element mounted on the heat dissipating material.

\* \* \* \* \*